(12) United States Patent
Kubota et al.

(10) Patent No.: US 7,367,108 B2
(45) Date of Patent: May 6, 2008

(54) METHOD OF BONDING FLYING LEADS

(75) Inventors: Takashi Kubota, Kawasaki (JP); Kenji Kobae, Kawasaki (JP); Kimio Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 11/391,362

(22) Filed: Mar. 29, 2006

(65) Prior Publication Data

US 2007/0137026 A1    Jun. 21, 2007

(30) Foreign Application Priority Data

Dec. 20, 2005    (JP)    ............................. 2005-366331

(51) Int. Cl.
*B23K 20/10* (2006.01)
(52) U.S. Cl. ............................... 29/603.04; 29/603.04; 29/603.06; 360/244.3; 228/110.1
(58) Field of Classification Search ............. 29/603.04, 29/603.06; 360/245.9, 244.3; 228/110.1
See application file for complete search history.

(56) References Cited

U.S. PATENT DOCUMENTS

| | | | |
|---|---|---|---|
| 3,939,559 A * | 2/1976 | Fendley et al. | ................ 29/827 |
| 4,591,087 A * | 5/1986 | Frasch | ...................... 228/110.1 |
| 5,029,746 A * | 7/1991 | Altpeter et al. | ............... 228/1.1 |
| 5,883,759 A * | 3/1999 | Schulz | ..................... 360/245.9 |
| 6,461,890 B1 | 10/2002 | Shibata | |
| 7,134,588 B2 * | 11/2006 | Kobae et al. | ................. 228/1.1 |
| 2005/0110161 A1 | 5/2005 | Naito et al. | |
| 2007/0137026 A1 * | 6/2007 | Kubota et al. | ........... 29/603.04 |

FOREIGN PATENT DOCUMENTS

| | | |
|---|---|---|
| JP | 5-63038 | 3/1993 |
| JP | 3-41744 | 6/1996 |
| JP | 8-146451 | 6/1996 |
| JP | 10-150137 | 6/1998 |
| JP | 10-189657 | 7/1998 |
| JP | 2002-83839 | 3/2002 |
| JP | 2004-146731 | 5/2004 |
| JP | 2005-93581 | 4/2005 |
| JP | 2005-136399 | 5/2005 |

* cited by examiner

*Primary Examiner*—Terrence R. Till
*Assistant Examiner*—Jossef Zilberman
(74) *Attorney, Agent, or Firm*—Kratz, Quintos & Hanson, LLP

(57) ABSTRACT

A method of bonding flying leads produces reliable bonds between the flying leads and substrate pads and can efficiently bond a plurality of flying leads and a plurality of substrate pads using a bonding tool. Flying leads are respectively aligned with a plurality of substrate pads disposed in parallel and a bonding tool applies ultrasonic vibration to the flying leads to bond the respective substrate pads and the flying leads. Bonding is carried out using a bonding tool in which (at least one contact member) a plurality of contact members that contact(s) the flying leads and apply (applies) the ultrasonic vibration thereto are (is) rotatably supported. The bonding tool is moved in a direction so as to cross the flying leads disposed in parallel with the plurality of contact members (at least one contact member) rolling while in contact with the flying leads, and the ultrasonic vibration is applied from the plurality of contact members (at least one contact member) to the flying leads to ultrasonically bond the respective flying leads to the substrate pads.

8 Claims, 4 Drawing Sheets

METHOD OF BONDING FLYING LEADS

BACKGROUND OF THE INVENTION

1. Field of the Invention

The present invention relates to a method of bonding flying leads, and in particular to a method of bonding flying leads to substrate pads using a method of ultrasonic bonding.

2. Background Art

FIG. 3 shows the overall construction of a carriage assembly used in a magnetic disk apparatus. The carriage assembly is formed by attaching suspensions 12, on which magnetic heads are mounted, to the front ends of a plurality of carriage arms 10 provided corresponding to the number of media. An actuator shaft 14 is provided at the base portions of the carriage arms 10 and the carriage arms 10 are rotated parallel to the surfaces of the media with the actuator shaft 14 as a support shaft.

There are a number of methods for electrically connecting the magnetic heads mounted on the suspensions 12 and a signal transfer circuit. FIG. 3 shows a connecting structure that uses so-called "long tail suspension substrates" where the end portions of suspension substrates provided on the suspensions 12 are formed so as to extend as far as attachment positions of a flexible substrate 16 attached to side surfaces of base parts of the carriage arms 10.

With a connecting structure that uses such long tail suspension substrates, substrate pads provided on the flexible substrates 16 and flying leads 18 that extend from base portions of the long tail suspension substrates are aligned and the flying leads 18 are bonded to the substrate pads using an ultrasonic tool. FIG. 4 shows a state where the flying leads 18 and substrate pads 17 provided on the flexible substrate 16 are ultrasonically bonded using a bonding tool 20.

Ultrasonic bonding is used when mounting a semiconductor chip on a substrate using flip-chip bonding or when bonding wires to leads, and a variety of methods have been proposed for reliably carrying out ultrasonic bonding.

Patent Document 1 discloses a method of wire bonding that presses a lead frame via a vibration suppressing member to prevent the lead frame from resonating. Patent Document 2 discloses a method of bonding that applies a conductive material onto substrate electrodes to form bonding electrodes and thereby provide sufficient bonding area. Patent Documents 3 and 4 disclose a method of bonding that interposes an anisotropic conductive film and applies ultrasound in a direction that causes tight attachment. Patent Document 5 discloses a method of bonding that roughens a bonding surface. Patent Document 6 discloses a method that applies a non-conductive bonding agent onto a bonding surface.

Patent Document 1
  Japanese Laid-Open Patent Publication No. H10-150137

Patent Document 2
  Japanese Laid-Open Patent Publication No. 2005-136399

Patent Document 3
  Japanese Laid-Open Patent Publication No. H08-146451

Patent Document 4
  Japanese Laid-Open Patent Publication No. H110-189657

Patent Document 5
  Japanese Laid-Open Patent Publication No. H05-63038

Patent Document 6
  Japanese Laid-Open Patent Publication No. 2005-93581

With the connecting structure that uses long tail suspension substrates shown in FIG. 3, since a large number of flying leads 18 are disposed in parallel at minute intervals, although it is possible to ultrasonically bond the flying leads 18 to the substrate pads 17 one at a time, as shown in FIG. 4, a method that ultrasonically bonds a plurality of the flying leads 18 in a single operation is more efficient.

In FIG. 4, the bonding tool 20 is placed in contact with two flying leads 18 to ultrasonically bond the leads. However, when a method that places the bonding tool 20 in contact with a plurality of flying leads 18 to ultrasonically bond the leads 18 is used, since the contact surface of the bonding tool 20 is formed as a flat surface, if convexes and concaves are present in the bonding surface, the bonding strength will differ at the respective bonding points, resulting in the problem of a lack of reliability for the bonds at the bonded parts.

FIG. 5 schematically shows a state where a bonding interface between the flying leads 18 and the substrate pads 17 is viewed from a cross-sectional direction (i.e., from the side). At the bonding interface, bonding is carried out with convexes in the surfaces of the bonded parts being crushed and an oxide film being damaged, resulting in a state including parts that are actually connected, parts that are connected via an oxide film, and parts A that are not connected.

The flying leads 18 and the substrate pads 17 both have external surfaces that are plated with metal and therefore are connected by bonding metal to metal. Such metal plating layers act so as to absorb any convexes and concaves in the surfaces of the flying leads 18 and the substrate pads 17. However, since the thickness of the metal plating layers is around 3 μm, the metal plating layers are not able to sufficiently absorb the convexes and concaves in the bonding surfaces.

SUMMARY OF THE INVENTION

The present invention was conceived to solve the problems described above and it is an object of the present invention to provide a method of bonding flying leads that can produce favorable bonds between flying leads and substrate pads and can ultrasonically bond flying leads to substrate pads efficiently.

To achieve the object described above, the present invention is a method of bonding flying leads that aligns the respective flying leads with respective substrate pads out of a plurality of substrate pads disposed in parallel and applies ultrasonic vibration to the flying leads using a bonding tool to bond the flying leads to the substrate pads, wherein a bonding tool is used in which at least one contact member, which contacts the flying leads and applies the ultrasonic vibration, is rotatably supported, and in a state where the at least one contact member rolls while in contact with the flying leads, the bonding tool moves in a direction so as to cross the flying leads disposed in parallel and the ultrasonic vibration is applied from the at least one contact member to the flying leads to ultrasonically bond the respective flying leads to the substrate pads.

When the at least one contact member is a plurality of contact members disposed in a direction of movement of the bonding tool, the ultrasonic vibration acts on the respective flying leads a plurality of times when the bonding tool moves, resulting in the flying leads and the substrate pads being reliably bonded together.

Rollers and balls may be favorably used as the at least one contact member used in the bonding tool.

Also, a method that aligns substrate pads provided on a flexible substrate and flying leads provided on long tail suspension substrates and ultrasonically bonds together the flying leads and the substrate pads using the method of bonding flying leads described above as a method of electrically connecting a flexible substrate attached to carriage arms and long tail suspension substrates can be favorably used as a method of assembling a carriage assembly.

With the method of bonding flying leads according to the present invention, it is possible to ultrasonically bond substrate pads and flying leads reliably and since flying leads disposed in parallel are bonded by merely moving a bonding tool so as to cross the flying leads, the method can be effectively used to ultrasonically bond together a plurality of substrate pads and flying leads.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

As one embodiment of a method of bonding flying leads according to the present invention, the following describes an example where flying leads 18 provided on long tail suspension substrates are bonded to a flexible substrate 16 when assembling a carriage assembly.

Figure 1:
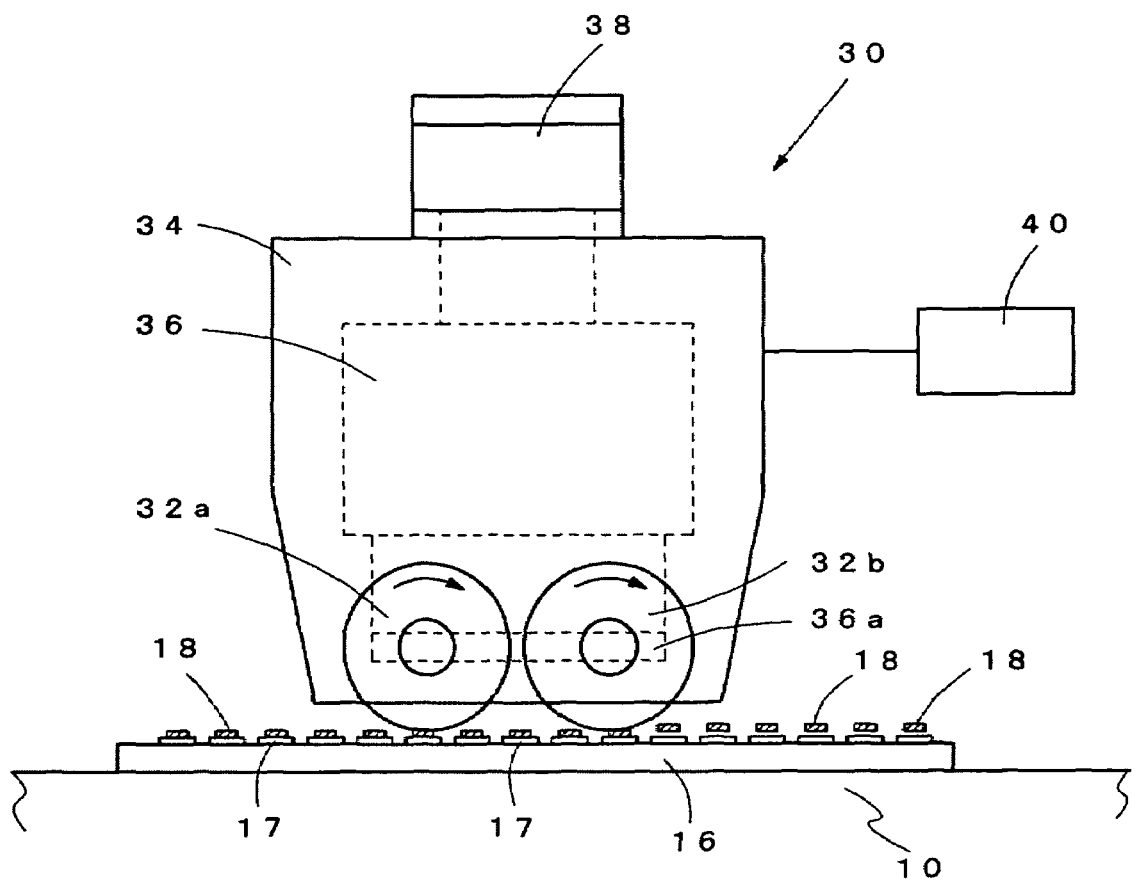
FIG. 1 is a schematic diagram showing the construction of a bonding tool and a state where flying leads and substrate pads are ultrasonically bonded using the bonding tool.

FIG. 1 shows a state where the flying leads 18 of long tail suspension substrates are bonded onto the flexible substrate 16 attached to side surfaces of carriage arms 10 using a bonding tool 30 for ultrasonic bonding.

The substrate pads 17 are exposed at predetermined intervals in parallel on a surface of the flexible substrate 16. The flying leads 18 extend in parallel as leads from base portions of the long tail suspension substrates. The flying leads 18 are formed on the suspension substrate so that a planar arrangement of the leads matches a planar arrangement of the substrate pads 17. FIG. 1 shows a state where the respective flying leads 18 have been positioned above the respective substrate pads 17 formed on the flexible substrate 16 and the flying leads 18 and the substrate pads 17 are being bonded together.

The bonding tool 30 of the present embodiment includes a pair of rollers 32a, 32b as contact members that contact upper surfaces of the flying leads 18 and apply ultrasonic vibration thereto. The rollers 32a, 32b are housed inside a holder 34 formed so that a lower surface thereof is open, with parts of the circumferential surfaces of the rollers 32a, 32b being exposed from the open surface of the holder 34.

The rollers 32a, 32b are rotatably supported on an arm portion 36a that extends from a vibrating body 36 connected to an ultrasound generating device 38 including an ultrasonic vibrator. The vibrating body 36 and the arm portion 36a are housed within the holder 34.

A moving mechanism 40 supports the holder 34, aligns the bonding tool 30 with a bonding position of the flying leads 18, and acts so as to move the bonding tool 30 in a direction perpendicular to the lengthwise direction of the flying leads 18 and the substrate pads 17.

Figure 2A:
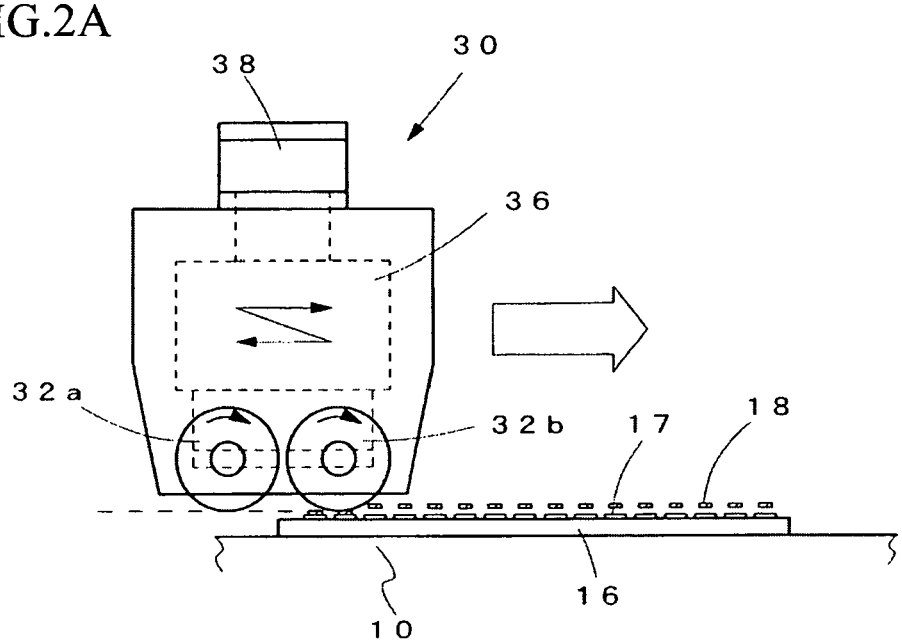
FIGS. 2A and 2B are schematic diagrams showing a method of bonding the flying leads and the substrate pads using the bonding tool.
Figure 2B:
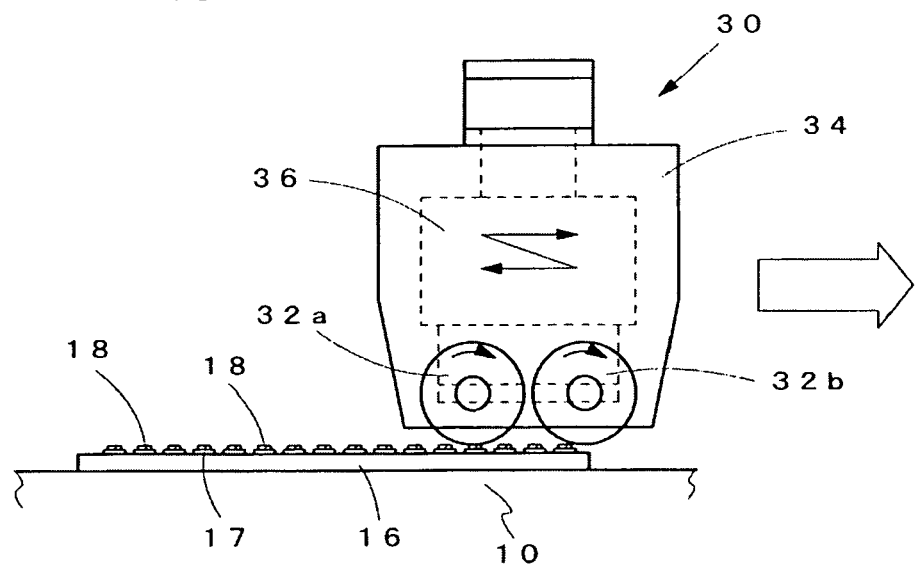
Figure 3:
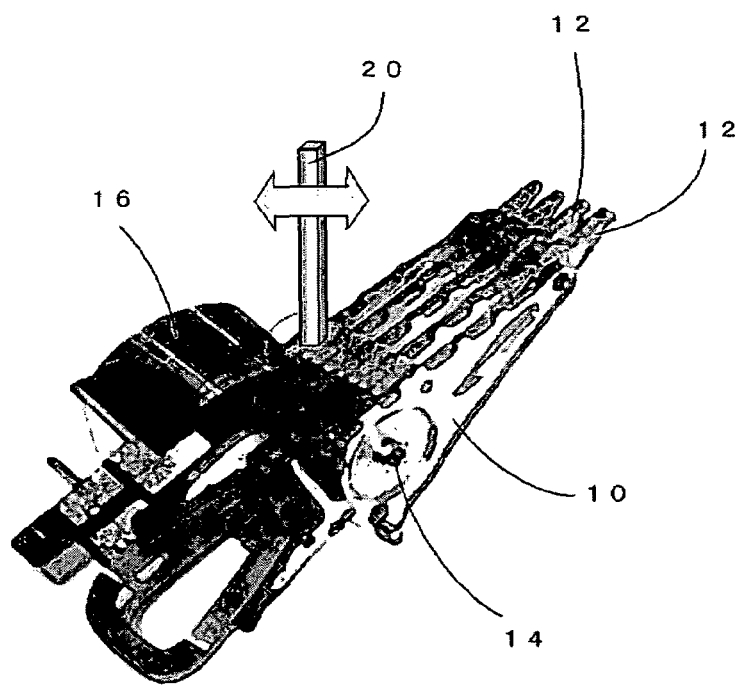
FIG. 3 is a perspective view showing a method of assembling a carriage assembly using long tail suspension substrates.

FIGS. 2A and 2B show a method of bonding the flying leads 18 to the substrate pads 17 using the bonding tool 30 according to the present embodiment.

Figure 4:
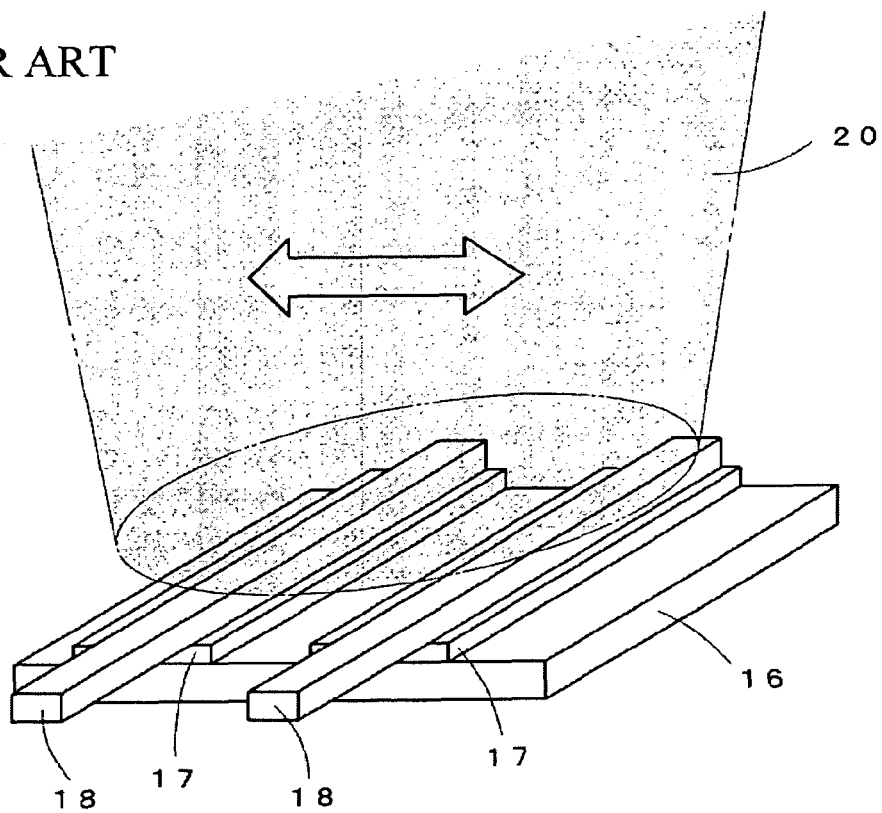
FIG. 4 is a diagram useful in explaining a conventional method of bonding flying leads and substrate pads using a bonding tool.
Figure 5:
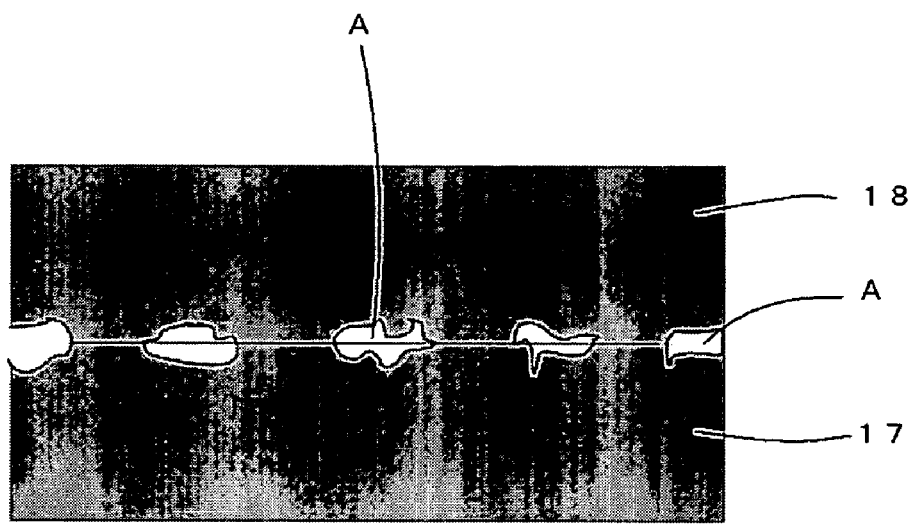
FIG. 5 is a diagram useful in showing the state of a bonding interface between a flying lead and a substrate pad.

FIG. 2A shows a state where the flying leads 18 have been aligned with the flexible substrate 16 and the bonding tool 30 has been positioned on one side of the flying leads 18 that are disposed in parallel. As shown in FIG. 4, the substrate pads 17 are exposed in a slim form on the flexible substrate 16. The long tail suspension substrates are positioned relative to the flexible substrate 16 so that the lengthwise direction of the flying leads 18 matches the lengthwise direction of the substrate pads 17.

The moving mechanism 40 moves the bonding tool 30 in a direction perpendicular to the lengthwise directions of the flying leads 18 and the substrate pads 17 in a state where the rollers 32a, 32b contact the flying leads 18 and ultrasound is applied to the vibrating body 36 by the ultrasound generating device 38.

By moving the bonding tool 30 while applying ultrasound to the vibrating body 36 using the ultrasound generating device 38, the flying leads 18 are pressed onto the surfaces of the substrate pads 17 with the flying leads 18 and the substrate pads 17 being bonded together due to the ultrasonic vibration of the rollers 32a, 32b.

In the state where the flying leads 18 are aligned with the substrate pads 17, the flying leads 18 are placed slightly apart from the upper surfaces of the substrate pads 17. When the rollers 32a, 32b move, the flying leads 18 are pressed by the outer circumferential surfaces of the rollers 32a, 32b so as to be pressed in toward the substrate pads 17, and therefore the flying leads 18 are accurately pressed onto the substrate pads 17 and reliably ultrasonically bonded to the substrate pads 17.

FIG. 2A shows a state where the bonding tool 30 has been positioned on one side of the flying leads 18 and only the roller 32b that leads in the direction of movement of the bonding tool 30 contacts the flying leads 18. By moving the bonding tool 30 from this state so as to cross the flying leads 18 disposed in parallel, an ultrasonic bonding action is produced for the respective flying leads 18 and substrate pads 17, so that all of the flying leads 18 and the substrate pads 17 are bonded together. FIG. 2B shows a state where the bonding tool 30 has moved to the vicinity of the other side of the flying leads 18 disposed in parallel.

By providing the pair of rollers 32a, 32b in the bonding tool 30 of the present embodiment, an ultrasonic bonding action is produced twice for the respective flying leads 18 by the leading roller 32b and the following roller 32a. By doing so, compared to the case where ultrasonic bonding is carried out by a single roller, the flying leads 18 and the substrate pads 17 can be bonded more reliably.

The operation that bonds the flying leads 18 to the substrate pads 17 using the bonding tool 30 according to the present embodiment is carried out so that the bonding tool 30 is caused to scan the flying leads 18 disposed in parallel in a direction perpendicular to the lengthwise direction of the leads, and therefore the amount of time for which the ultrasonic vibration acts on the individual flying leads 18 is short. Accordingly, using a plurality of contact members (rollers) as in the present embodiment is effective in that ultrasonic vibration acts on the flying leads 18 a plurality of times during a single operation.

Also, since the rollers 32a, 32b are supported on the vibrating body 36 inside the bonding tool 30 according to the present embodiment so as to be freely rotatable, when the bonding tool 30 moves so as to cross the flying leads 18, the rollers 32b themselves rotate and therefore it is possible to carry out ultrasonic bonding while moving the bonding tool 30 without damaging the flying leads 18.

In addition, by using rollers as the contact members that apply the ultrasonic vibration, compared to the conventional art where contact members with flat contact surfaces are used, it is possible to have the ultrasonic vibration act in a concentrated manner on the individual flying leads 18, and therefore ultrasonic bonding can be carried out reliably. Even if convexes and concaves are formed in the bonding surfaces of the substrate pads 17 and the bonding surfaces of the flying leads 18 or if there are fluctuations in the thicknesses of the substrate pads 17 and the flying leads 18, since the ultrasonic vibration acts on the respective flying leads 18 from the rollers 32a, 32b, fluctuations during manufacturing for the flying leads 18 and the flexible substrate 16 can be absorbed and the flying leads 18 can be reliably bonded to the substrate pads 17.

By doing so, it is possible to increase the bonding reliability of the bonded parts of the flexible substrate of the carriage assembly and the suspension substrates.

It should be noted that the method of bonding flying leads according to the present invention is not limited to assembling the carriage assembly described above and can be applied in exactly the same way to ultrasonically bonding leads formed as flying leads and substrate pads of a wiring circuit.

In the case where a plurality of flying leads are disposed in parallel, by moving a bonding tool in a direction perpendicular to the orientation of the flying leads in a state where the flying leads and the substrate pads are aligned, it is possible to carry out the ultrasonic bonding of the flying leads and the substrate pads extremely efficiently and reliably.

It should be noted that although the contact members that apply the ultrasonic vibration are formed by rollers in the embodiment described above, it is possible to use balls in place of the rollers. When balls are used, it is possible to reduce the contact area with the connected parts compared to when rollers are used and therefore it is possible to have the ultrasonic vibration act in a more concentrated manner on the connected parts.

Also, although the rollers 32a, 32b are attached to the vibrating body 36 in the embodiment described above, it is possible to use a construction where the rollers 32a, 32b are attached to the holder 34 and ultrasonic vibration is applied to the holder 34. Also, it is possible to use only one contact member to apply the ultrasonic vibration or to use three or more members.

What is claimed is:

1. A method of bonding flying leads that aligns the respective flying leads with respective substrate pads out of a plurality of substrate pads disposed in parallel and applies ultrasonic vibration to the flying leads using a bonding tool to bond the flying leads to the substrate pads,
   wherein a bonding tool including a vibrating body is used in which plural contact members, which contact the flying leads and apply the ultrasonic vibration, are rotatably supported on the vibrating body,
   and in a state where the plural contact members roll while in contact with the flying leads, the bonding tool moves in a direction so as to cross the flying leads disposed in parallel and the ultrasonic vibration is applied from plural contact members to the flying leads to ultrasonically bond the respective flying leads to the substrate pads.

2. A method of bonding flying leads according to claim 1, wherein the plural contact members are disposed in a direction of movement of the bonding tool.

3. A method of bonding flying leads according to claim 2, wherein the plural contact members used in the bonding tool are rollers.

4. A method of bonding flying leads according to claim 2, wherein the plural contact members used in bonding tool are balls.

5. A method of bonding flying leads according to claim 1, wherein the plural contact members used in the bonding tool are rollers.

6. A method of bonding flying leads according to claim 1, wherein the plural contact members used in bonding tool are balls.

7. A method of assembling a carriage assembly, wherein substrate pads provided on a flexible substrate and flying leads provided on long tail suspension substrate are aligned and the flying leads and the substrate pads are ultrasonically bonded together using the method of bonding flying leads according to claim 1 as a method of electrically connecting the flexible substrate, which is attached to carriage arms, and the long tail suspension substrates.

8. The method of claim 1,
   wherein the plural contact members roll while in contact with the flying leads, such that one contact member leads the others, and each of the flying leads is ultrasonically bonded by each of the contact members in succession.

* * * * *